United States Patent [19]
Baskin

[11] Patent Number: 6,087,898
[45] Date of Patent: Jul. 11, 2000

[54] CLOSED LOOP FEED FORWARD SYSTEM FEATURING CARRIER REUTILIZATION FOR SYNCHRONOUS DETECTION

[76] Inventor: Brian Baskin, 10740 Maxine Ave., Cupertino, Calif. 95014

[21] Appl. No.: 09/146,628

[22] Filed: Sep. 3, 1998

[51] Int. Cl.[7] .................................................... H03F 1/32
[52] U.S. Cl. .......................................... 330/151; 330/149
[58] Field of Search .................................... 330/149, 151; 455/126

[56] References Cited

U.S. PATENT DOCUMENTS

| | | | |
|---|---|---|---|
| 5,051,704 | 9/1991 | Chapman et al. | 330/52 |
| 5,386,198 | 1/1995 | Ripstrand et al. | 330/149 |
| 5,455,537 | 10/1995 | Larkin et al. | 330/52 |
| 5,528,196 | 6/1996 | Baskin et al. | 330/151 |
| 5,570,063 | 10/1996 | Eisenberg | 330/149 |
| 5,770,971 | 6/1998 | McNicol | 330/149 |
| 5,789,976 | 8/1998 | Ghannouchi et al. | 330/149 |
| 5,796,304 | 8/1998 | Gentzler | 330/151 |

*Primary Examiner*—Robert Pascal
*Assistant Examiner*—Khanh Van Nguyen

[57] ABSTRACT

The present invention encompasses an amplifier system comprising: an input signal port for providing an input signal; a modulating signal source for providing a modulating signal; a first feed forward loop coupled to the input signal port and the modulating signal source, the first feed forward loop modulating the input signal with the modulating signal, amplifying a first modulated input signal, outputting a first amplified modulated signal including distortion signals, and outputting a first difference signal; a first synchronous detection circuit coupled to the first feed forward loop and the modulating signal source, the first synchronous detection circuit outputting a first control signal in response to the first difference signal and the modulating signal, wherein the first control signal controls modulation of the input signal by the modulating signal such that the first difference signal consists of only distortion signals; a second feed forward loop coupled to the first feed forward loop, the second feed forward loop modulating the first difference signal, amplifying a second modulated input signal, and outputting a second amplified modulated signal; a second synchronous detection circuit coupled to the second feed forward loop and the modulating signal source, the second synchronous detection circuit outputting a second control signal in response to a second difference signal which represents a difference between the first amplified modulated signal and the second amplified modulated signal, wherein the second control signal controls modulation of the first difference signal in order to cancel the distortion signals in the first amplified modulated signal by the second amplified modulated signal; and an output signal port coupled to the first feed forward loop and the second feed forward loop, the output signal port outputting an output signal that is a function of the first amplified modulated signal and the second amplified modulated signal.

17 Claims, 2 Drawing Sheets

CLOSED LOOP FEED FORWARD SYSTEM FEATURING CARRIER REUTILIZATION FOR SYNCHRONOUS DETECTION

BACKGROUND OF INVENTION

1. Field of the Invention

This invention relates generally to feed forward systems and, in particular, to feed forward systems which control the phase and/or amplitude of the output signal.

2. Description of the Related Art

Feed forward correction, invented by Harold S. Black in 1924, is limited in performance primarily due to variations in system components over power, temperature, and time. Several circuits have been employed in order to limit these variations. These circuits, however, introduce other limitations.

U.S. Pat. No. 5,051,704 issued to Chapman et al., which is incorporated herein by reference, discloses a feed forward amplifier which utilizes a least-means squared circuit in order to detect and cancel system errors. The least-means squared circuit, however, generates internal errors due to leakage signals inherent in the correlators of the least-means squared circuit. These correlators use mixing devices in order to generate an error signal necessary for correction. A typical mixer or Gilbert cell typically passes RF signals from the local oscillator (LO) and RF port to the intermediate frequency (IF) port whose output signal is generally attenuated with respect to the RF port input and varies over time, temperature and power. Variations of the IF output over time, temperature, and power limit the least-means squared circuit's accuracy to detect and cancel system errors. As a result, variations over time, temperature, and power are not entirely eliminated by the above system.

U.S. Pat. No. 5,528,196 issued to Baskin et al., which is incorporated herein by reference, discloses a feed forward amplifier in which a differential phase/amplitude detector is utilized to control the cancellation of the information signals (i.e., the carrier signals) at the output of the summer of the first loop, and an out-of-band pilot (reference) signal is employed in order to control the distortion signals output by the second loop so as to cancel distortion signals at the RF output port. The differential phase/amplitude detector of the first loop requires separate detectors for each of two RF signals that it receives, i.e. the RF signal from the amplifier of the first loop and the RF signal from the RF input port. Any difference in efficiency of these detectors over various conditions results in reduced cancellation of the information signal by the first loop. Furthermore, even when the differential phase/amplitude detector allows cancellation of the information signal at the output of the summer of the first loop, the information signals may leak into and infiltrate the low power stages of the second loop. The pilot signal for the second loop must be located far out of the frequency band of interest, i.e., the frequency band that contains the information signals and their accompanying distortion products, in order to avoid errors caused by interference from the information signals and accompanying distortion products, and to avoid feedthrough of the distortion products to the output. Accuracy of the control system is limited because RF performance of components varies over frequency, thus accuracy out of band does not necessarily imply in-band accuracy of the loop. As the pilot signal is outside the frequency band of interest, it does not necessarily correct for time, temperature, and power variations within the frequency band of interest. Furthermore, as in the first loop, the control system (i.e., the loop 2 amplitude and phase controller) of the second loop utilizes separate detectors for each of its input paths. Any difference in the efficiency of these detectors over various conditions results in reduced cancellation of the distortion signals by the second loop.

As a result, there is a need in the art for an RF amplifier feed forward correction system that provides stable amplification of the input RF signal over variations in power, temperature, and time, while avoiding the aforementioned limitations, as well as others, of prior art systems.

SUMMARY OF INVENTION

In the present invention, only a single detector, rather than multiple detectors, is used in order to adjust the output of each one of the feed forward loops. In other words, a first single detector is used to adjust the output of the first feed forward loop while a second single detector is used to adjust the output of the second feed forward loop. The use of a single detector to adjust the output of a single feed forward loop eliminates the problems associated with using multiple detectors to adjust the output of a single feed forward loop, namely it eliminates the reduced cancellation due to differences between the multiple detectors used to adjust the output of a single feed forward loop.

Additionally, in the present invention, the amplified output of the summer of the first feed forward loop is used to adjust the output of the first feed forward loop as well as to cancel distortion signals at the RF output port. Therefore, leakage of the carrier signals from the summer of the first feed forward loop to the second feed forward loop are accounted for by the first feed forward loop. In other words, the output of the first feed forward loop is adjusted to account for leakage of carrier signals into the summer of the first feed forward loop or into the second feed forward loop.

Moreover, the feed forward system of the present invention uses a modulation signal (i.e., a signal used to modulate the RF input signal) to synchronously detect and correct errors in the first and second feed forward loops. In other words, the modulation signal is used to synchronously adjust the outputs of the first and second feed forward loops. Furthermore, the feed forward system of the present invention amplitude detects both phase modulated signals and amplitude modulated signals and synchronously detects the modulation signal in the first and second feed forward loops in order to adjust the outputs of the first and second feed forward loops. The synchronous detection, among other things, allows detection of signals below noise level.

The present invention encompasses an amplifier system comprising: an input signal port for providing an input signal; a modulating signal source for providing a modulating signal; a first feed forward loop coupled to the input signal port and the modulating signal source, the first feed forward loop modulating the input signal with the modulating signal, amplifying a first modulated input signal, outputting a first amplified modulated signal including distortion signals, and outputting a first difference signal; a first synchronous detection circuit coupled to the first feed forward loop and the modulating signal source, the first synchronous detection circuit outputting a first control signal in response to the first difference signal and the modulating signal, wherein the first control signal controls modulation of the input signal by the modulating signal such that the first difference signal consists of only distortion signals; a second feed forward loop coupled to the first feed forward loop, the second feed forward loop modulating the first difference signal, amplifying a second modulated input signal, and outputting a second amplified modulated signal; a second synchronous detection circuit coupled to the second feed forward loop and the modulating signal source, the second synchronous detection circuit outputting a second control signal in response to a second difference signal which represents a difference between the first amplified modulated signal and the second amplified modulated signal, wherein the second control signal controls modulation of the first difference signal in order to cancel the distortion signals in the first amplified modulated signal by the second amplified modulated signal; and an output signal port coupled to the first feed forward loop and the second feed forward loop, the output signal port outputting an output signal that is a function of the first amplified modulated signal and the second amplified modulated signal.

DETAILED DESCRIPTION OF THE INVENTION

Figure 1:
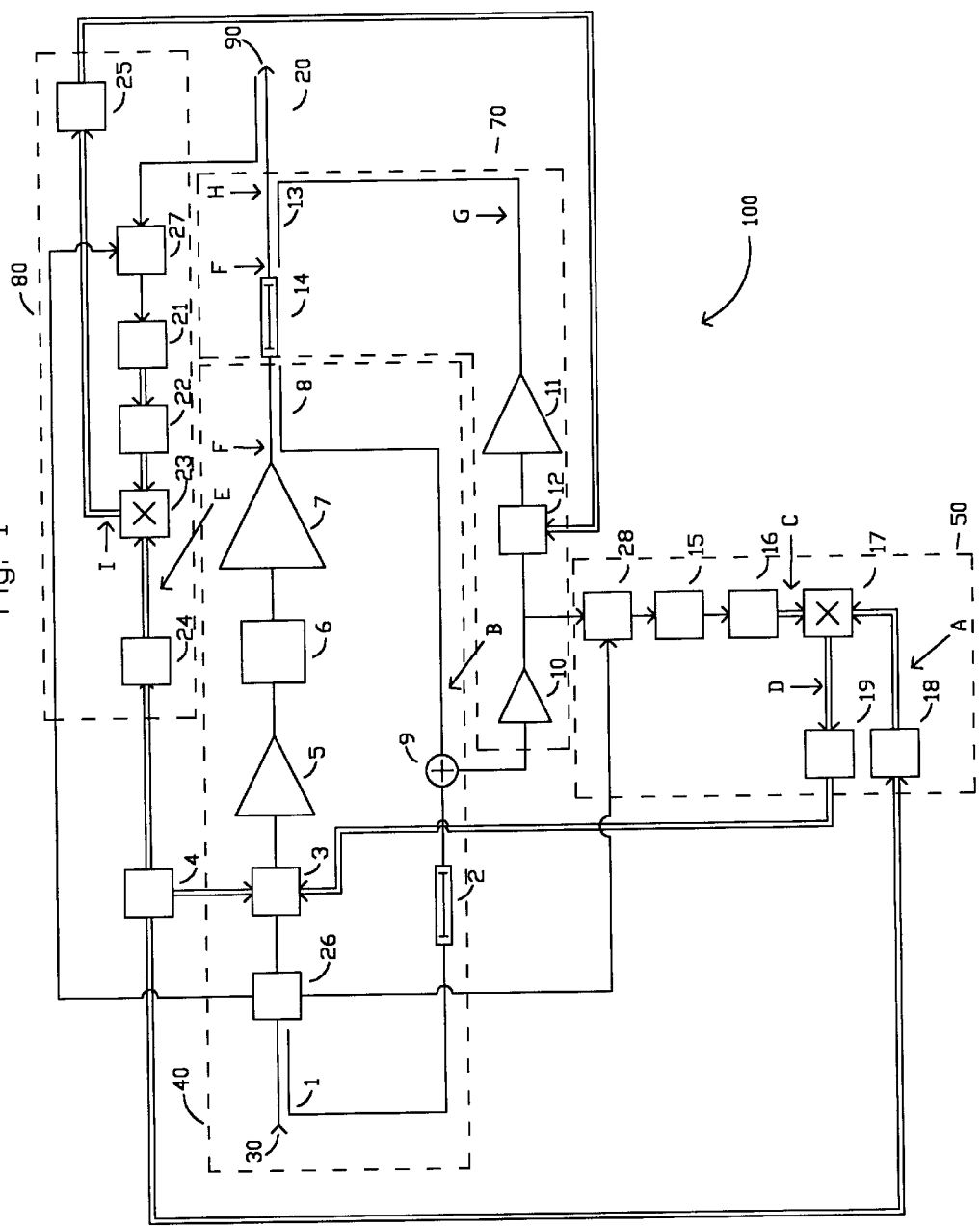
FIG. 1 is schematic diagram of a present embodiment of the invention.

FIG. 1 is schematic diagram of a present embodiment of the invention. In FIG. 1, amplifier system 100 comprises an RF input port 30, a first feed forward loop 40, a first synchronous detection circuit 50, a dual wideband noise source 4, a second feed forward loop 70, a second synchronous detection circuit 80, and an RF output port 90. Each of the synchronous detection circuits may also be herein referred to as a receiver circuit, a feedback loop circuit, or a heterodyne synchronous detection circuit.

The RF input port 30 and RF output port 90 are for inputting an RF input signal into and outputting an RF output signal from the amplifier system 100, respectively.

The first feed forward loop 40 includes a coupler 1, a modulator 3, an amplifier 5 (which may also herein be referred to as a driver amplifier 5), a linearizer 6, an amplifier 7, a coupler 8, a delay line 2, and a summer 9. The modulator 3 may be a phase and/or an amplitude modulator. The first feed forward loop 40 may, as in the present embodiment of the invention, also include an amplitude detector, such as amplitude detector 26. Amplitude detector 26 detects the RF input signal and adjusts the output of the automatic gain control (AGC) circuits 27 and 28 so as to maintain the input power to amplitude detectors 15 and 16 within a reasonable narrow power range even when the RF input power level is varied.

The first feed forward loop 40 receives an RF input signal (which is also herein referred to as the carrier signal) from RF input port 30 and phase and/or amplitude modulation signals from the dual wideband noise source 4. The first feed forward loop amplitude and/or phase modulates the RF input signal with the modulation signal(s), amplifies the modulated RF signal, and outputs an amplified modulated RF signal, including distortion signals, to delay line 14 via coupler 8 and distortion signals to amplifier 10 via summer 9. The distortion signals may include distortions due to the modulation and amplification of the RF input signal, as well as intermodulation signals and other distortion signals.

Coupler 1 splits the RF input from the RF input port 30 and provides inputs to the amplitude detector 26 and the delay line 2. The output of amplitude detector 26 is input to the modulator 3. The modulator 3 is AC coupled to the dual wideband noise source 4 and receives modulation signals therefrom. Dual wideband noise source 4 is in a present embodiment a frequency sweeper and outputs low frequency signals to the modulator 3. In one embodiment, dual wideband noise source 4 provides signals of 72.5 and 75.5 kHz for phase modulation of the carrier signal by modulator 3 and signals of 73.5 and 74.5 kHz for amplitude modulation of the carrier signal by modulator 3. It is to be noted that the dual wideband noise source 4 may be replaced by any signal source or frequency generator that generates a modulation signal to be input to modulator 3. For example, the dual wideband noise source 4 may be replaced by a dual narrow band noise source. The modulation signal acts as a reference or pilot signal, i.e., a known and identifiable signal within the system. The signals from the dual wideband noise source 4 are used by modulator 3 to modulate the signal it receives from amplitude detector 26. The modulator 3 amplitude and/or phase modulates the signal. Amplitude and phase modulation of a signal is herein used to encompass adjustments in the amplitude and phase, respectively, of that signal, i.e., it includes DC offset adjustments. The modulated signal is fed from the modulator 3 to the first amplifier chain, which includes amplifier 5, linearizer 6, and amplifier 7. The first amplifier chain amplifies the modulated RF signal and outputs an amplified modulated RF signal. Linearizer 6 introduces linearization signals to cancel non-linear signals introduced by amplifier 5 and amplifier 7.

As stated above, amplifier 7 outputs an amplified modulated RF signal. The amplified modulated RF signal includes distortion signals. The distortion signals may include distortions due to the modulation and amplification of the RF input signal, as well as intermodulation signals and other distortion signals. In the frequency domain, the amplified modulated RF signal may be represented by the RF input signal frequency spectrum (i.e., the carrier spectrum) and the sideband spectrums, which are due to the modulation of the RF input signal. (The sideband spectrums maintain their relative position with respect to the carrier spectrum as the carrier is shifted in the frequency domain, i.e., the pilot signal spectrum shifts with, or follows, the carrier spectrum as the carrier spectrum is shifted in the frequency domain. As a result, the pilot in the present invention remains with the frequency band of interest and not outside of it.) The output of amplifier 7 is input to coupler 8. Coupler 8 outputs an attenuated signal to the summer 9 and a substantially unattenuated signal to delay line 14. The attenuation at coupler 8 is intended to offset attenuation of the signal coupled to delay line 2 by coupler 1 and the amplification of the modulated signal by the first amplifier chain. Delay line 2 is intended to account for the delay in the signal path from coupler 1 to the summer 9 via coupler 8. Delay line 2 is also intended to introduce a 180 degree phase difference, over the desired frequency range, between the signal that it inputs to summer 9 and the signal that is input to summer 9 by coupler 8. The output of delay line 2 to the summer 9 is an unmodulated and an unamplified version of the original RF input signal that is 180 degrees out of phase with respect to the output of coupler 8 to summer 9. As a result, the output of summer 9 is intended to consist of only the distortion signals due to the modulation and the amplification of the RF input signal by modulator 3 and the first amplifier chain. In other words, the output of the delay line 2 is combined with equal power, but a relative 180° phase difference, with the sampled output of coupler 8 to produce a difference signal at the output of summer 9 which is intended to consist of only the distortion signals. The difference signal is used by both the first synchronous detection circuit 50 and the second feed forward loop 70.

The difference signal is amplified by amplifier 10, then fed into the first synchronous detection circuit 50. The first synchronous detection circuit 50 includes an automatic gain control (AGC) circuit 28, an amplitude detector 15, a filter 16, a dual multiplier chain 17, a low pass filter (LPF) 18 and a dual LPF 19.

Filter 16 may be a single or dual LPF. Alternatively filter 16 may be a single or dual band pass filter (BPF). In the embodiment shown in FIG. 2, filter 16 is a single BPF. One BPF in the dual BPF may be used to filter signals that are in a first frequency band due to amplitude modulation while the other BPF in the dual BPF may be used to filter signals that are in a second frequency band due to phase modulation, where the first frequency band is different from the second frequency band.

AGC circuit 28, which is controlled by amplitude detector 26, receives the output of amplifier 10. It is to be noted that although AGC circuit 28 receives its input signal from amplifier 10, AGC 28 may receives its input signal anywhere along the error amplifier chain, which includes amplifiers 10 and 11. However, it is more advantageous that AGC circuit 28 receive its input signal from the error amplifier chain at a point before the modulator 12. The AGC circuit 28 feeds its output to the amplitude detector 15. The output of the AGC circuit 28 is adjusted by amplitude detector 26, which detects the RF input signal, so as to maintain the input power to amplitude detector 15 within a reasonably narrow power range even when the RF input signal power level is varied. It is to be noted that the AGC circuit 28 may receive its adjustment signal from anywhere along the main signal path, which is the signal path from the RF input port 30 to RF output port 90 via amplitude detector 26, modulator 3, amplifier 5, linearizer 6, amplifier 7, and delay line 14.

The amplitude detector 15 amplitude detects its input and outputs an amplitude detected signal. In other words, amplitude detector 15 down-converts its input signal from the frequency range of the RF input signal to the frequency range of the signal from the dual wideband noise source 4. When the output of summer 9 contains signals other than the distortion signals due to phase or amplitude imbalance in the first feed forward loop 40, then amplitude detection by amplitude detector 15 provides a wideband noise source signal that has the same frequency as the wideband noise source signal output by wideband noise source 4 and is either substantially in phase or substantially 180 degrees out of phase with the respective wideband noise source signal output by the wideband noise source 4. In other words, if the first feed forward loop 40 is unbalanced with regard to amplitude, the signal provided by amplitude detector 15 is either substantially in phase or substantially 180 degrees out of phase with the amplitude modulating wideband noise source signal output by the dual wideband noise source 4. Similarly, if the first feed forward loop is unbalanced with regard to phase, the signal provided by amplitude detector 15 is either substantially in phase or substantially 180 degrees out of phase with the phase modulating wideband noise source signal output by the dual wideband noise source 4. When the output of summer 9 consists of only distortion signals, then amplitude detection by amplitude detector 15 provides a wideband noise source signal whose frequency is twice that of the respective wideband noise source signal output by the dual wideband noise source 4. Amplitude detector 15 may in the present embodiment be a diode amplitude detector circuit. The amplitude detected output of amplitude detector 15 is fed through filter 16 into the dual multiplier chain 17.

The output of the dual wideband noise source 4 is fed into a second set of ports of the dual multiplier chain 17 through the single or dual LPF 18. The dual LPF 18 delays the signals from the dual wideband noise source 4 before feeding them into the dual multiplier chain 17. Alternatively, delay line 2, or some other delay line, may be used to delay the signals from the dual wideband noise source 4 prior to feeding the signals to the dual multiplier chain 17. When delay line 2 is used to delay the signals from the dual wideband noise source 4, a set of frequency splitters would be used with delay line 2. The frequency splitters (which may be a diplexor) include a first low capacitance capacitor (not shown) coupled between coupler 1 and delay line 2, a second low capacitance capacitor (not shown) coupled between delay line 2 and summer 9, a first inductor (not shown) coupled between the dual wideband noise source 4 and the delay line 2, and a second inductor (not shown) coupled between the delay line 2 and the dual multiplier chain 17, where each of the first and second inductors has an inductance that is high enough to block transmission of the RF input signal yet low enough to allow transmission of the signals from the dual wideband noise source 4.

One multiplier in the dual multiplier chain 17 is used to multiply signals from one wideband noise source in the dual wideband noise source 4 while the other multiplier in the dual multiplier chain 17 is used to multiply signals from the other wideband noise source in the dual wideband noise source 4. A dual wideband noise source is used to allow phase and amplitude modulation to be done using modulating signals having different frequencies.

By multiplying the signal received from amplitude detector 15 via filter 16 with the signal received from the dual wideband noise signal source 4 via dual LPF 19, the dual multiplier chain 17 converts the signals detected by the amplitude detector 15 to the respective frequency of the signal from the dual wideband noise source 4, but with an included DC offset which is due to the phase and/or amplitude modulation error of the RF input signal by the modulator 3. The output of the dual multiplier chain 17 is then fed, through the dual LPF 19, to the modulator 3.

The signal fed through dual LPF 19 to the modulator 3 controls the attenuation of the RF input signal by the modulator 3 such that there is maximum cancellation of the RF input signal at the output of summer 9. Thus, the signals from the dual wideband noise source 4 are used to modulate the RF input signal by modulator 3 as well as to control the attenuation/phase of the RF input signal by modulator 3 so as to provide maximum cancellation of the RF input signal at the output of summer 9.

A positive DC output from dual LPF 19 causes modulator 3 to increase the attenuation of the RF input signal so as to reduce the amplitude of the output of amplifier 7 such that the output of summer 9 consists of only distortion signals. A negative DC output from dual LPF 19 causes modulator 3 to reduce the attenuation of the RF input signal so as to increase the amplitude of the output of amplifier 7 such that the output of summer 9 consists of only distortion signals. A zero DC output from dual LPF 19 does not affect the attenuation of the RF input signal in modulator 3 and indicates exact cancellation of the original RF input signal at the output of summer 9 such that the output of summer 9 consists of only distortion signals.

For phase modulation, adjustments analogous to those in the previous paragraph are made in response to outputs from the dual LPF 19 to modulator 3. A positive DC output from dual LPF 19 causes modulator 3 to increase the phase of the RF input signal so as to reduce the phase of the output of amplifier 7 such that the output of summer 9 consists of only distortion signals. A negative DC output from dual LPF 19 causes modulator 3 to reduce the phase of the RF input signal so as to increase the phase of the output of amplifier 7 such that the output of summer 9 consists of only distortion signals. A zero DC output from dual LPF 19 does not affect the phase of the RF input signal in modulator 3 and indicates exact cancellation of the original RF input signal at the output of summer 9 such that the output of summer 9 consists. of only distortion signals.

Figure 2:
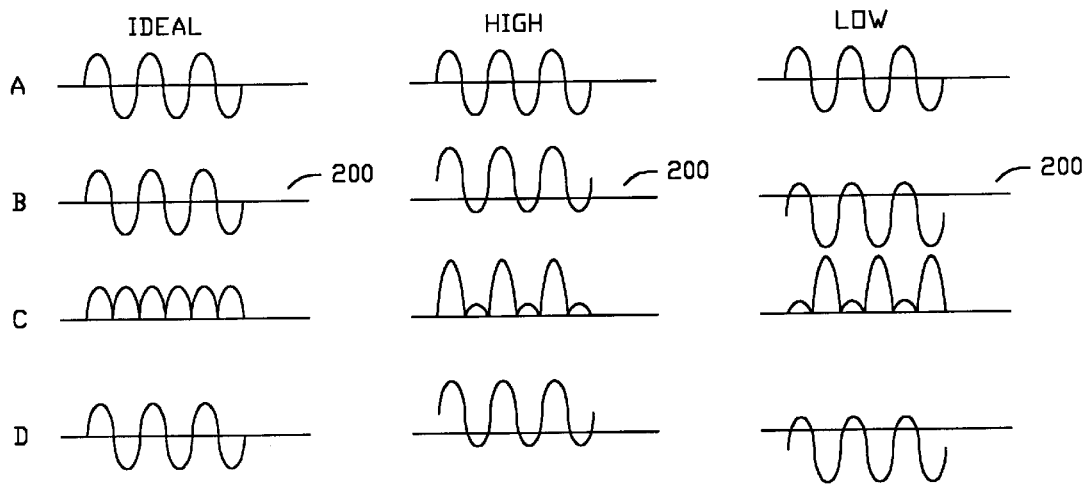
FIG. 2 shows the signal output by the dual wideband noise source and signals at various points within the first synchronous detection circuit under various phase/amplitude modulation conditions.

FIG. 2 shows the signal output by the dual wideband noise source 4 and signals at various points within the first synchronous detection circuit 50 under various phase and/or amplitude error conditions.

When the phase/amplitude of the output of amplifier 7 is ideal, phase/amplitude error signal (B), which is the signal at point (B), in FIG. 1, referenced to the phase and amplitude of the signal output by delay line 2, is perfectly symmetrical about the zero error axis 200 (i.e., the lobes above the zero error axis 200 are equal to the lobes below the zero error axis 200). In other words, when the phase/amplitude of the output of amplifier 7 is ideal, the output of summer 9 consists of only distortion signals. Also, when the phase/amplitude of the output of amplifier 7 is ideal, the output of amplitude detector 15, represented by the signal at point (C), in FIG. 1, has a frequency that is exactly twice the frequency of the modulation signal output by the dual wideband noise source 4. Thus, when the phase/amplitude of the output of amplifier 7 is ideal, the phase and amplitude modulation vary the cancellation at the output of the summer 9 to provide an output signal from summer 9 that has double frequency of the signal output by the dual wideband noise source. In other words, the first feed forward loop 40 in conjunction with the first synchronous detection circuit 50 acts as a frequency doubler. Finally, when the phase/amplitude of the output of amplifier 7 is ideal, the output of dual multiplier chain has a DC offset equal to zero. As a result, the output of dual LPF 19 is zero and the attenuation/phase adjustment of the RF input signal at the modulator 3 is unaffected.

When the phase/amplitude of the output of amplifier 7 is high, the phase/amplitude error (B) is shifted upward with respect to the zero error axis 200. Furthermore, the amplitude detection signal (C) has uneven lobes with the larger lobes corresponding to the positive half cycles of the noise source output (A). Thus, the multiplier output (D) has a positive DC offset. The dual LPF 19 sends a positive DC signal to the modulator 3 which causes modulator 3 to increase the attenuation/phase adjustment of the RF input signal prior to modulation. The increased attenuation/phase adjustment of the RF input signal causes the amplitude/phase of the output of amplifier 7 to decrease. This increase in the attenuation of the RF input signal in modulator 3 continues until the DC offset is eliminated, i.e., the DC offset is zero. As mentioned above, the DC offset is zero when the phase/amplitude of the output of amplifier 7 is ideal.

When the phase/amplitude of the output of amplifier 7 is low, the phase/amplitude error (B) is shifted downward with respect to the zero error axis 200. Furthermore, the amplitude detection signal (C) has uneven lobes with the larger lobes corresponding to the negative half cycles of the noise source output (A). Thus, the multiplier output (D) has a negative DC offset. The dual LPF 19 sends a negative DC signal to the modulator 3 which causes modulator 3 to reduce the attenuation/phase adjustment of the RF input signal prior to modulation. The reduced attenuation/phase adjustment of the RF input signal causes amplitude/phase of the output of amplifier 7 to increase. This reduced attenuation of the RF input signal in modulator 3 continues until the DC offset is eliminated, i.e., the DC offset is zero. As mentioned above, the DC offset is zero when the phase/amplitude of the output of amplifier 7 is ideal.

Referring back to FIG. 1, as mentioned above, the difference signal is also input to the second feed forward loop 70. The second feed forward loop 70 includes an amplifier 10, a modulator 12, an amplifier 11, a delay line 14 and a coupler 13. The amplifier 10 and 11 are part of the error amplifier chain. The difference signal is amplified by amplifier 10. The output of the amplifier 10 is fed to modulator 12. Modulator 12, which may be a phase and/or amplitude modulator, modulates the input from amplifier 10 and feeds its modulated output signal to amplifier 11. It is to be noted that, as in the case of modulator 3, the amplitude and phase modulation of a signal by modulator 12 is herein used to encompass adjustments in the amplitude and phase, respectively, of that signal, i.e., it includes DC offset adjustments. Amplifier 11 amplifies the modulated signal it receives from modulator 10 and feeds its amplified modulated output to coupler 13. Coupler 13 injects the amplified modulated signal it receives from amplifier 11 at point H so as to be combined with the output of delay line 14. The output of amplifier 11 represents distortion signals. Delay line 14 delays the output it receives from coupler 8 and outputs a delayed signal that is 180 degrees out of phase with respect to the signal injected by coupler 13. The signal output by delay line 14 is a delayed version of the amplified modulated signal output by amplifier 7. As mentioned above the amplified modulated signal output by amplifier 7 includes distortion signals due to the modulation and amplification in the first feed forward loop 40. Moreover, the signal output by delay line 14 is 180 degrees out of phase with respect to the amplified modulated signal output amplifier 7 as well as the distortion signal output by amplifier 11. The RF output port 90 outputs an output signal that is the sum of the output of delay line 14 and the amplifier 11. The attenuation and phase shifting at modulator 12 is controlled by the second synchronous detection circuit 80 such that the output of amplifier 11 cancels the distortions in the amplified modulated RF input signal output by delay line 14.

The second synchronous detection circuit 80 includes coupler 20, AGC circuit 27, amplitude detector 21, filter 22, dual multiplier chain 23, LPF 24 and dual LPF 25. Filter 22 may be a single or dual LPF. Alternatively, filter 22 may be a single or dual BPF. In the embodiment shown in FIG. 1, filter 22 is a single BPF.

As in the first synchronous detection circuit 50, use of dual elements within the second synchronous detection circuit 80 allows simultaneous processing of two signals of different frequencies. One element in a dual element set processes signals having a first frequency while a second element in the dual element set processes signals having a second frequency.

The RF output signal of the system, which is the sum of the output of amplifier 11 and delay line 14, is sampled via output coupler 20 and fed to the AGC circuit 27. The AGC circuit 27, which is controlled by amplitude detector 26, feeds its output to the amplitude detector 21. The output of AGC circuit 27 is adjusted by amplitude detector 26, which detects the RF input signal, so as to maintain the power input to amplitude detector 21 within a reasonably narrow power range when the RF input power is varied.

The amplitude detector 21 amplitude detects its input and outputs an amplitude detected signal. Amplitude detector 21, like amplitude detector 15, may in the present embodiment be a simple diode amplitude detector. The amplitude detected output of amplitude detector 15 is fed through filter 22 into the dual multiplier chain 23. The output of the dual wideband noise source 4 is fed into a second set of ports of the dual multiplier chain 23 through LPF 24.

The LPF 24 delays the signals from the dual wideband noise source 4 before feeding it into the dual multiplier chain 23. Alternatively, delay line 2 and delay line 14, or some other delay line or lines, may be used to delay the signals from the dual wideband noise source 4 prior to feeding the signals to the dual multiplier chain 23. When delay line 2 and delay line 14 are used to delay the signals from the dual wideband noise source 4, a set of frequency splitters (which may be diplexors) would be used with delay line 2 and delay line 14. The frequency splitters used in conjunction with delay line 2 would include a first low capacitance capacitor (not shown) coupled between coupler 1 and delay line 2, a second low capacitance capacitor (not shown) coupled between delay line 2 and summer 9, a first inductor (not shown) coupled between the dual wideband noise source 4 and the delay line 2, a second inductor (not shown) coupled between the delay line 2 and the dual multiplier chain 23, where each of the first and second inductors has an inductance that is sufficiently high so as to block transmission of the RF input signal yet is sufficiently low so as to allow transmission of the signals from the dual wideband noise source 4. The frequency splitters used in conjunction with delay line 14 would include a first low capacitance capacitor (not shown) coupled between coupler 8 and delay line 14, a second low capacitance capacitor (not shown) coupled between delay line 14 and point H, a first inductor (not shown) coupled between the dual wideband noise source 4 and the delay line 14, a second inductor (not shown) coupled between the delay line 14 and the dual multiplier chain 23, where each of the first and second inductors has an inductance that is sufficiently high so as to block transmission of the RF input signal yet is sufficiently low so as to allow transmission of the signals from the dual wideband noise source 4.

One multiplier in the dual multiplier chain 23 is used to multiply signals from one wideband noise source in the dual wideband noise source 4 while the other multiplier in the dual multiplier chain 23 is used to multiply signals from the other wideband noise source in the dual wideband noise source 4. A dual wideband noise source is used to allow phase and amplitude modulation to be done using modulating signals having different frequencies.

By multiplying the signal received from amplitude detector 21 via filter 22 with the signal received from the dual wideband noise signal source 4 via LPF 24, the dual multiplier chain 17 converts the signals detected by the amplitude detector 21 to double the frequency of the signal from the dual wideband noise source 4, but with an included DC offset which is due to the phase and/or amplitude modulation of the RF output signal.

The output of the dual multiplier chain 23 is then fed, through the dual LPF 25, to the modulator 12. The signal fed through dual LPF 25 to the modulator 12 controls the attenuation/phase adjustment of the difference signal by the modulator 12 such that there is maximum cancellation of the distortion signals at the RF output port 90. Thus, the signals from the dual wideband noise source 4 are used to modulate the RF input signal by modulator 3, to control the attenuation of the RF input signal by modulator 3 so as to provide maximum cancellation of the RF input signal at the output of summer 9, and to control the attenuation/phase adjustment of the distortion or difference signal by modulator 12 so as to provide maximum cancellation of the distortion signals at the RF output port 90.

Figure 3:
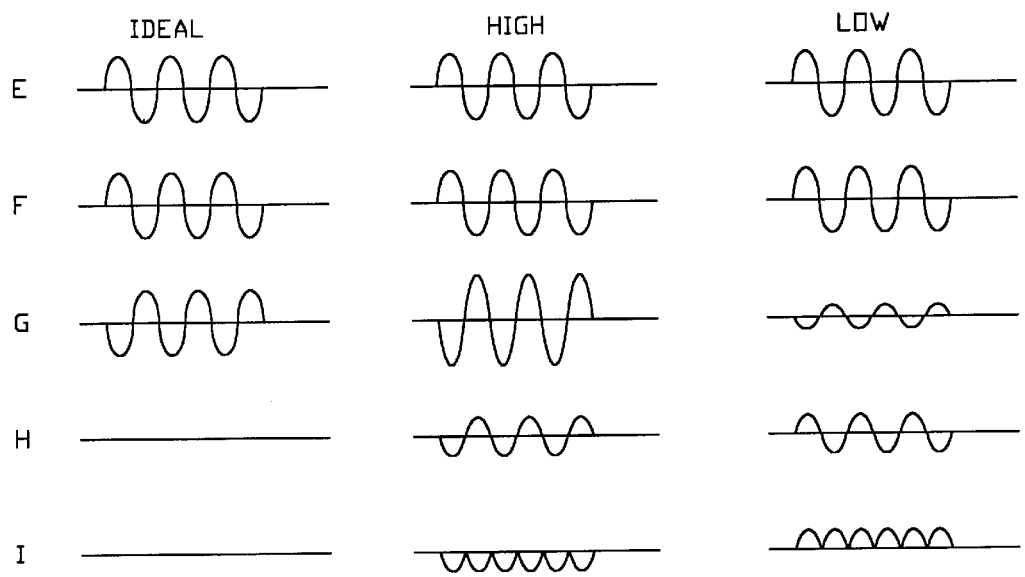
FIG. 3 shows the signal output by the dual wideband noise source and signals at various points within the amplifier system under various amplitude modulation conditions by the second feed forward loop.

FIG. 3 shows the signal output by the dual wideband noise source 4 and signals at various points within the amplifier system 100 under various amplitude modulation conditions by the second feed forward loop 70.

Under ideal phase/amplitude modulation conditions in the second feed forward loop 70, the amplitude modulation (F), i.e., the signal at point (F), in FIG. 1, due to modulation in the first feed forward loop 40, is of equal amplitude but of opposite phase (i.e., 180 degrees out of phase) with respect to the output of amplifier 11, i.e., amplitude correction (G). The sum of amplitude modulation (F) and amplitude modulation (G) is zero at point (H) and thus the residual modulation at point (H) is zero. In other words the distortion signal from the second feed forward loop 70 perfectly cancels the distortion signals in the amplified modulated signal output by the amplifier 7. Consequently, the multiplier output (I) is also zero and the modulation of the modulator 12 is not changed.

Under high amplitude modulation conditions in the second feed forward loop 70, the amplitude correction (G) is out of phase with and larger in amplitude than the amplitude modulation (F). Therefore, the residual modulation (H) is out of phase with the amplitude modulation (F). The residual modulation (H) is also out of phase with the noise source output (E). Consequently, the multiplier output (I) has a negative DC offset and has twice the frequency of the noise source output (E). The negative DC offset is applied to the modulator 12 via dual LPF 25 and causes the modulator 12 to increase the attenuation of the signal which it modulates. This increased attenuation causes the amplitude correction (G) to reduce in amplitude. This increased attenuation is continued until the multiplier output (I) is eliminated, i.e., is zero.

Under low amplitude modulation conditions in the second feed forward loop 70, the amplitude correction (G) is out of phase with and smaller in amplitude than the amplitude modulation (F). Therefore, the residual modulation (H) is in phase with the amplitude modulation (F). The residual modulation (H) is also in phase with the noise source output (E). Consequently, the multiplier output (I) has a positive DC offset and has twice the frequency of the noise source output (E). The positive DC offset is applied to the modulator 12 via dual LPF 25 and causes the modulator 12 to reduce the attenuation of the signal which it modulates. This reduced attenuation causes the amplitude correction (G) to increase in amplitude. This increased attenuation is continued until the multiplier output (I) is eliminated, i.e., is zero.

For phase modulation, adjustments analogous to those for amplitude modulation are made at modulator 12. Under ideal phase/amplitude modulation conditions, the phase at modulator 12 is not changed. Under high phase modulation conditions, a negative DC offset is applied to the modulator 12 via dual LPF 25 and causes the modulator 12 to increase the phase of the signal which it modulates. This phase increase causes the phase modulation at modulator 12 to decrease. The decrease in phase modulation is continued until the multiplier output (I) is eliminated, i.e., is zero. Under low phase modulation conditions, a positive DC offset is applied to the modulator 12 via dual LPF 25 and causes the modulator 12 to decrease the phase of the signal which it modulates. This phase decrease causes the phase modulation at modulator 12 to increase. The increase in phase modulation is continued until the multiplier output (I) is eliminated, i.e., is zero.

Figure 4:
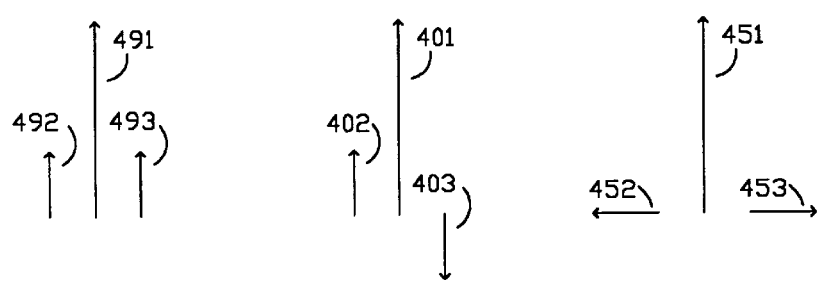
FIG. 4 shows the relation between phase and amplitude modulation.

FIG. 4 shows the relation between phase and amplitude modulation. In FIG. 4, for phase modulation, vector 401 represents the carrier spectrum while vectors 402 and 403 represent the sideband spectrums. Similarly, for amplitude modulation, vector 451 represents the carrier spectrum while vectors 452 and 453 represent the sideband spectrums. Vector 491 represents the carrier spectrum for a reference amplitude modulation signal while vectors 492 and 493 represent the sideband spectrums for the reference amplitude modulation signal. The length of each vector indicates the amplitude of the spectrum represented by that vector. The horizontal distance between the base point of two vectors represents the frequency spread between the spectrums represented by the two vectors. The direction in which a vector points indicates the relative phase of the signal represented by the vector. For example, vectors 401 and 402 both point upward in the vertical direction. Similarly, vectors 491 and 492 also point upward in the vertical direction. Therefore, the relative phase of vectors 401 and 402 is in phase with the relative phase of vectors 491 and 492. Vector 403 points downward and is, therefore, out of phase with vector 493, which points downward in the vertical direction. Also, the frequency difference between the signals represented by vectors 402 and 401 is identical to and out of phase with the frequency difference between the signals represented by vectors 403 and 401. As a result, the combination of signals represented by vectors 401, 402, and 403 is a signal of constant amplitude that is phase modulated. The signal represented by vector 452 has a positive 90 degree with respect to the signal represented by vector 492. The signal represented by vector 453 has a negative 90 degree phase with respect to the signal represented by vector 493. Also, the frequency difference between signals represented by vectors 452 and 451 is identical to and in phase with the frequency difference between the signals represented by vectors 453 and 451. As a result, the combination of signals represented by vectors 451, 452, and 453 is a signal having a varying amplitude and thus is amplitude modulated. As can be seen in FIG. 4, the difference between the vectors for the amplitude and phase modulation is limited to the difference in the orientation of the sideband vector 402 and its corresponding sideband vector 452 and the difference in the orientation of the sideband vector 403 and its corresponding sideband vector 453. If vector 402 is rotated counterclockwise (i.e., towards the left) by 90 degrees about its base point, then it would have the same orientation as vector 452. This indicates vectors 402 and 452 are 90 degrees out of phase with respect to each other. Similarly, if vector 403 is rotated clockwise (i.e., towards the right) by 90 degrees about its base point, then it would have the same orientation as vector 453. This indicates that vectors 403 and 453 are also 90 degrees out of phase with respect to each other. Thus, phase modulation will convert to amplitude modulation if the phase of the difference frequency between one side band and the carrier is delayed by 90 degrees, and if the difference frequency between the remaining side band and the carrier is advanced by 90 degrees, or, more generally, if the total rotation difference between the two sideband signals with respect to the carrier signal is equal to 180 degrees. Therefore, introducing a 90 degree phase shift in the sidebands of an amplitude modulated signal would generate the sidebands that would have been achieved by phase modulation of the original signal. Similarly, introducing a 90 degree phase shift in the sidebands of a phase modulated signal would generate the sidebands that would have been achieved by amplitude modulation of the original signal. Note that the corresponding modulation is delayed 90 degrees for phase to amplitude conversion when the sidebands are shifted positively in phase and is advanced by 90 degrees for an amplitude to phase conversion when the sidebands are shifted positively in phase. The converse is true when the sidebands are shifted negatively in phase.

The above relation between phase and amplitude modulation allows using amplitude detectors to detect phase modulation in the following manner. If the output of amplifier 11 lags in phase, the sidebands of the output of amplifier 11 combine with the carrier signal at F, lagging in phase by 90 degrees with respect to the sidebands at F. This produces amplitude modulation which, when amplitude detected, is 90 degrees lagging in phase with respect to the phase modulating wideband noise source signal at coupler 20. This amplitude modulation is detected by amplitude detector 21 by way of the AGC circuit 27. A 90 degree phase shifted and delayed signal from the wide band noise source 4 used to phase modulate a carrier by modulator 3 is multiplied by a filtered version of the output of amplitude detector 21 using the phase portion of dual multiplier chain 23, i.e., the multiplier in dual multiplier chain 23 used for multiplying phase modulation related signals. The output of dual multiplier chain 23 contains a double frequency of the phase portion of dual multiplier chain 23 and a positive DC voltage. The DC voltage from the phase portion of dual multiplier chain 23 is filtered by one LPF in the dual LPF 25 and causes modulator 12 to lead in phase. Conversely, if the output of amplifier 11 leads in phase, the sidebands of the output of amplifier 11 combine with the carrier signal at F, leading in phase by 90 degrees with respect to the sidebands at F. This produces amplitude modulation, which, when amplitude detected, is 90 degrees leading in phase with respect to the phase modulating wideband noise source signal at coupler 20. This amplitude modulation is detected by amplitude detector 21 by way of AGC circuit 27. A 90 degree phase shifted and delayed signal from the wide band noise source 4 used to phase modulate a carrier by modulator 3 is multiplied by a filtered version of the output of amplitude detector 21 using the phase portion of the dual multiplier chain 23. The output of dual multiplier chain 23 contains a double frequency of the signal input to the phase portion of dual multiplier chain 23 and a negative DC voltage. The DC voltage from the phase portion of dual multiplier chain 23 is filtered by one LPF in the dual LPF 25 and causes modulator 12 to lag in phase.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

I claim:

1. An amplifier system comprising:

an input signal port for providing an input signal;

a modulating signal source for providing a modulating signal;

a first feed forward loop coupled to said input signal port and said modulating signal source, said first feed forward loop modulating the input signal with the modulating signal, amplifying a first modulated input signal, outputting a first amplified modulated signal including distortion signals, and outputting a first difference signal, wherein the first difference signal is a function of the input signal and the first amplified modulated signal;

a first synchronous detection circuit comprising:

a first amplitude detector means configured to detect amplitude modulation coupled to said first feed forward loop, said first squaring means outputting a first detected modulation frequency signal in response to the first difference signal; and a multiplier coupled to said first amplitude detector means and said modulating signal source, said first multiplier outputting a first control signal in response to the first detected modulation frequency signal and the modulating signal, wherein the first control signal controls modulation of the input signal such that the first difference signal consists of only distortion signals;

a second feed forward loop coupled to said first feed forward loop, said second feed forward loop modulating the first difference signal, amplifying a second modulated input signal, and outputting a second difference signal, wherein the second difference signal is a function of the first amplified modulated signal and a second amplified modulated signal;

a second synchronous detection circuit comprising:

a second amplitude detector means configured to detect amplitude modulation coupled to said second feed forward loop, said second squaring means outputting a second detected modulation frequency signal in response to said second difference signal; and a second multiplier coupled to said second amplitude detector means and said modulating signal source, said second multiplier outputting a second control signal in response to said second detected modulation frequency signal, wherein the second control signal controls modulation of the first difference signal in order to cancel the distortion signals in the first amplified modulated signal by the second amplified modulated signal; and an output signal port coupled to said second feed forward loop, said output signal port outputting an output signal that is a function of the first amplified modulated signal and the second amplified modulated signal.

2. An amplifier system comprising:

an input signal port for providing an input signal, wherein said input signal port is configured to receive an RF input signal;

a modulating signal source for providing a modulating signal, wherein said modulating signal source is configured to provide a wideband noise signal that is used to modulate the RF input signal;

a first modulator coupled to the input signal port and the modulating signal source, said first modulator modulating the input signal with the modulating signal and outputting a first modulated signal;

a first amplifier coupled to said first modulator for amplifying a signal that is a function of the first modulated signal and outputting a first amplified modulated signal;

means for isolating a first difference signal comprising:

a coupler coupled to said first amplifier;

a delay element coupled to said input signal port, said delay element outputting a delayed RF signal that is approximately 180 degrees out of phase with respect to the first amplified modulated signal;

a summer coupled to said coupler and said delay element, said summer receiving the delayed RF signal and an attenuated version of the first amplified modulated signal, summing the delayed RF signal and the attenuated version of the first amplified modulated signal, and outputting a first difference signal, wherein the first difference signal is the sum of the delayed RF signal and the attenuated version of the first amplified modulated signal;

a first synchronous detection circuit coupled to said isolating means, said modulating signal source, and said first modulator, said first synchronous detection circuit providing a first adjustment signal to said first modulator, wherein the adjustment signal is a function of the first difference signal and the modulating signal;

a second modulator coupled to said isolating means, said second modulator modulating a signal that is a function of the first difference signal and outputting a second modulated signal;

a second amplifier coupled to said second modulator for amplifying the second modulated signal and outputting a second amplified modulated signal;

a second synchronous detection circuit coupled to said first amplifier, said second amplifier, said modulating signal source, and said second modulator, said second synchronous detection circuit providing a second adjustment signal to said second modulator, wherein the second adjustment signal is a function of the first amplified modulated signal, the second amplified modulated signal, and the modulating signal; and an output signal port coupled to said first amplifier and said second amplifier, said output signal port outputting an output signal that is a function of the first amplified modulated signal and the second amplified modulated signal.

3. The amplifier system of claim 2, wherein said first modulator is an amplitude modulator and amplitude modulates the RF input signal with the wideband noise signal.

4. The amplifier system of claim 3, wherein said first synchronous detection circuit includes:

a first amplitude detector coupled to the summer, said first amplitude detector amplitude detecting the difference signal and outputting a first amplitude detection signal;

a first filter for filtering the first amplitude detection signal; and a first multiplier coupled to said first filter and said modulating signal source, said first multiplier multiplying the output of said first filter with a low passed version of the modulating signal source and outputting a first multiplication signal.

5. The amplifier system of claim 4, wherein said first synchronous detection circuit further includes a first low pass filter coupled to said first multiplier and said first amplitude modulator for filtering said first multiplication signal and outputting a first control signal to said first amplitude modulator, wherein said control signal causes the first amplitude modulator to adjust the attenuation of the RF input signal such that the difference signal consists only of distortion signals.

6. The amplifier system of claim 5, wherein said second synchronous detection circuit includes:
  a second amplitude detector coupled to said first amplifier and said second amplifier for amplitude detecting the output signal and outputting a second amplitude detection signal;
  a second filter for filtering the second amplitude detection signal; and
  a second multiplier coupled to said second filter and said modulating signal source, said second multiplier multiplying the output of said second filter with a second low passed version of the modulating signal source and outputting a second multiplication signal.

7. The amplifier system of claim 6, wherein said second synchronous detection circuit further includes a second low pass filter coupled to said second multiplier and said second amplitude modulator for filtering said second multiplication signal and outputting a second control signal to said second amplitude modulator, wherein said second control signal causes the second amplitude modulator to adjust the attenuation of its input signal such that the second amplified modulated signal cancels distortion signals from the first amplitude modulated signal.

8. An amplifier system comprising:
  an RF input signal port for providing an RF input signal;
  a wideband noise source for providing a wideband noise signal for modulating the RF input signal;
  a first modulator coupled to the RF input signal port and the wideband noise source, said first modulator modulating the RF input signal with the wideband noise signal and outputting a first modulated signal;
  a first amplifier coupled to said first modulator for amplifying a signal that is a function of the first modulated signal and outputting a first amplified modulated signal;
  a first coupler coupled to said first amplifier, said first coupler outputting an attenuated version of the first amplified modulated signal and a substantially unattenuated version of the first amplified modulated signal;
  a first delay element coupled to said RF input port, said delay element outputting a first delayed signal that is approximately 180 degrees out of phase with respect to the first amplified modulated signal;
  a first summer coupled to said first coupler and said first delay element, said first summer adding the first delayed signal and the attenuated version of the first amplified modulated signal and outputting a first sum signal;
  a first synchronous detection circuit coupled to said summer, said wideband noise source, and said first modulator, said first synchronous detection circuit including:
    a first amplitude detector for amplitude detecting the first sum signal and outputting a first amplitude detected signal;
    a first filter for filtering the first amplitude detected signal and outputting a first filtered amplitude detected signal;
    a first multiplier, said first multiplier receiving the first filtered amplitude detected signal and a first low passed version of the wideband noise signal, said first multiplier multiplying the first filtered amplitude detected signal and the first low passed version of the wideband noise signal and outputting a first multiplication result; and
    a first low pass filter coupled to said first multiplier and said first modulator, said first low pass filter receiving the first multiplication result and outputting a first low passed multiplication result, wherein said first low passed multiplication result is input to said first modulator to adjust attenuation of the RF input signal such that the first sum signal substantially consists of distortion signals;
  a second modulator coupled to said first summer, said second modulator modulating the first sum and outputting a second modulated sum;
  a second amplifier coupled to said second modulator for amplifying the second modulated signal and outputting a second amplified modulated signal;
  a second delay element coupled to the first amplifier, said second delay element outputting a second delayed amplified modulated signal;
  a second synchronous detection circuit coupled to said second delay element, said wideband noise source, and said second modulator, said second synchronous detection circuit including:
    a second amplitude detector for amplitude detecting the second delayed amplified modulated signal and outputting a second amplitude detected signal;
    a second filter for filtering the second amplitude detected signal and outputting a second filtered amplitude detected signal;
    a second multiplier, said second multiplier receiving the second filtered amplitude detected signal and a second low passed version of the wideband noise signal, said second multiplier multiplying the second filtered amplitude detected signal and the second low passed version of the wideband noise signal and outputting a second multiplication result; and
    a second low pass filter coupled to said second multiplier and said second modulator, said second low pass filter receiving the second multiplication result and outputting a second low passed multiplication result, wherein said second low passed multiplication result is input to said second modulator to adjust attenuation of the first sum signal to improve cancellation of distortion signals in the first amplified modulated signal by the second amplified modulated signal; and
  an output signal port coupled to said first amplifier, said second amplifier, and said second synchronous detection circuit, said output signal port outputting an output signal that is a function of the first amplified modulated signal and the second amplified modulated signal.

9. A method of amplifying an input signal, said method comprising:
  first modulating the input signal with a first modulation signal to output a first modulated signal, wherein said first modulated signal comprises an input frequency signal and a modulation sideband frequency signal;
  amplifying a function of the first modulated signal to output a first amplified modulated signal;
  subtracting a function of the input signal from a function of the amplified modulated signal to output a first difference signal;
  generating a first attenuation adjustment signal to adjust attenuation of said first modulated signal, wherein said first attenuation adjustment signal is a function of the first modulation signal, a substantially canceled input frequency signal, and the modulation sideband frequency signal, wherein said substantially canceled input frequency signal and said modulation sideband frequency signal are comprised in the first difference signal;

modulating a function of the first difference signal to output a second modulated signal;

amplifying the second modulated signal to output a second amplified modulated signal;

outputting an output signal that is a function of the first amplified modulated signal and the second amplified modulated signal; and generating a second attenuation adjustment signal to adjust attenuation of said second modulated signal, wherein said second attenuation adjustment signal is a function of the first modulation signal, the input frequency signal, and a substantially canceled modulation sideband frequency signal, wherein said input frequency signal and said substantially canceled modulation sideband frequency signal are comprised in the output signal.

10. An amplifier system comprising:

an input signal port for providing an input signal;

a modulating signal source for providing a modulating signal;

a first modulator coupled to the input signal port and the modulating signal source, said first modulator modulating the input signal with the modulating signal and outputting a first modulated signal;

a first amplifier coupled to said first modulator for amplifying a signal that is a function of the first modulated signal and outputting an amplified modulated signal;

means for isolating a first difference signal comprising a summing element, said summing element receiving a sample of the input signal from said input signal port and an attenuated version of the amplified modulated signal from said first amplifier, summing the sample of the input signal and the attenuated version of the amplified modulated signal, and outputting the first difference signal, wherein the first difference signal is the sum of the sample of the input signal and the attenuated version of the amplified modulated signal;

a first synchronous detection circuit comprising:

a first amplitude detector means configured to detect amplitude modulation coupled to said isolating means, said first amplitude detector means outputting a first amplitude detected modulation frequency signal in response to the first difference signal; and a first multiplication means coupled to said first amplitude means, said modulating signal source, and said first modulator, said first multiplication means providing a first adjustment signal to said first modulator, wherein the adjustment signal is a function of the first amplitude detected modulation frequency signal and the modulating signal;

a second modulator coupled to said isolating means, said second modulator modulating a signal that is a function of the first difference signal and outputting a modulated first difference signal;

a second amplifier coupled to said second modulator for amplifying the modulated first difference signal and outputting an amplified modulated first difference signal;

an output signal port coupled to said first amplifier and said second amplifier, said output signal port outputting an output signal that is a function of the amplified modulated signal and the amplified modulated first difference signal; and a second synchronous detection circuit comprising:

a second amplitude detector means coupled to said first and said second amplifier, said second amplitude detector means outputting a second amplitude detected modulation frequency signal in response to a second difference signal which represents the difference between the amplified modulated signal and the amplified modulated first difference signal; and a second multiplication means coupled to said second amplitude detector means, said modulating signal source, and said second modulator, said second multiplication means providing a second adjustment signal to said second modulator, wherein the second adjustment signal is a function of the second amplitude detected modulation frequency signal and the modulating signal.

11. The amplifier system of claim 10, wherein said first modulator is configured to provide phase modulation.

12. The amplifier system of claim 11, wherein said first multiplication means includes a first multiplier coupled to said first amplitude detector means and said modulating signal source, said first multiplier multiplying the output of said first amplitude detector means with said modulating signal and outputting a first multiplication signal, wherein the first multiplication signal is for modulating phase of said first modulator.

13. The amplifier system of claim 12, wherein said first multiplication means further includes a first low pass filter coupled to said first multiplier and said first modulator for filtering said first multiplication signal.

14. The amplifier system of claim 13, wherein said second multiplication means includes a second multiplier coupled to said second squaring means and said modulating signal source, said second multiplier multiplying the output of said second squaring means with said modulating signal and outputting a second multiplication signal, wherein the second multiplication signal is for modulating phase of said second modulator.

15. The amplifier system of claim 14, wherein said second multiplication means further includes a second low pass filter coupled to said second multiplier and said second modulator for filtering said second multiplication signal.

16. The amplifier system of claim 15, wherein said input signal port is for receiving an RF input signal and said modulating signal source is configured to provide a wideband noise signal that is used to modulate the RF input signal.

17. The amplifier system of claim 16, wherein said means for isolating further includes:

a coupler coupled to said first amplifier;

a delay element coupled to said input port, said delay element outputting a delayed input signal that is approximately 180 degrees out of phase with respect to the amplified modulated signal.

* * * * *